(12) United States Patent
Emmi et al.

(10) Patent No.: US 6,178,660 B1
(45) Date of Patent: Jan. 30, 2001

(54) PASS-THROUGH SEMICONDUCTOR WAFER PROCESSING TOOL AND PROCESS FOR GAS TREATING A MOVING SEMICONDUCTOR WAFER

(75) Inventors: Peter A. Emmi, Hyde Park; Byeongju Park, Wappingers Falls, both of NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/366,146

(22) Filed: Aug. 3, 1999

(51) Int. Cl.[7] .................................................. F26B 5/04
(52) U.S. Cl. .................... 34/412; 34/92; 34/216; 34/257
(58) Field of Search .................. 34/255, 258, 526, 34/60, 61, 413, 418, 420, 448, 412, 92, 216, 257, 209, 210, 215, 217, 218; 414/217, 221

(56) References Cited

U.S. PATENT DOCUMENTS

| 4,795,299 | * | 1/1989 | Boys et al. ........................... 414/257 |
| 4,917,556 | * | 4/1990 | Stark et al. ........................... 414/217 |
| 5,228,206 | | 7/1993 | Grant et al. ............................... 34/1 |
| 5,423,971 | | 6/1995 | Arnold et al. ..................... 04/298.11 |
| 5,529,657 | * | 6/1996 | Ishii ..................................... 156/345 |
| 5,611,861 | | 3/1997 | Higashi ................................. 118/719 |
| 5,755,938 | | 5/1998 | Fukui et al. ..................... 204/298.23 |
| 5,759,334 | | 6/1998 | Kojima et al. ....................... 156/345 |
| 5,855,675 | * | 1/1999 | Doering et al. ..................... 118/719 |
| 5,863,170 | * | 1/1999 | Boitnott et al. ..................... 414/222 |
| 5,880,924 | * | 3/1999 | Kumar et al. ........................ 361/234 |
| 5,882,165 | * | 3/1999 | Maydan et al. ..................... 414/217 |
| 5,886,864 | * | 3/1999 | Dvorsky ............................... 361/234 |

* cited by examiner

Primary Examiner—Denise L. Ferensic
Assistant Examiner—Michelle A. Mattera
(74) Attorney, Agent, or Firm—Ratner & Prestia

(57) ABSTRACT

A pass-through, wafer-processing tool for treating a moving semiconductor wafer with a process gas. The tool comprises an open-ended, non-isolated processing module having a wafer path through the module, vacuum manifolds mounted adjacent the wafer entry to and wafer exit from the module, and a gas manifold between the vacuum manifolds adapted to direct process gas onto the moving wafer. The gas manifold may deliver plasma ions generated by a remote plasma unit outside the module. Instead, a plasma may be generated inside the pass-through, wafer processing tool and, if so, the tool further comprises a top electrode mounted above the wafer passage. A wafer handler, which may be a robotic handler, carries the wafer through the wafer passage and serves as a bottom electrode. The gas manifold delivers reactive gas between the moving wafer and the top electrode while an RF source connected to the top electrode delivers sufficient RF energy to generate a plasma from the reactive gas between the top electrode and the wafer. One or more pass-through, wafer-processing tools may be part of an integrated system of semiconductor wafer processing tools. Processes for treating semiconductor wafers with process gas using the above apparatus are also disclosed.

24 Claims, 5 Drawing Sheets

PASS-THROUGH SEMICONDUCTOR WAFER
PROCESSING TOOL AND PROCESS FOR
GAS TREATING A MOVING
SEMICONDUCTOR WAFER

TECHNICAL FIELD

The present invention relates generally to processing of semiconductor wafers and, more specifically, to treatment of moving semiconductor wafers.

BACKGROUND OF THE INVENTION

Semiconductor processing comprises a complex series of sequential steps through a number of semiconductor processing tools adapted to perform various operations. Such operations include, but are by no means limited to, photoresist deposition, exposure, and development; etching; deposition of conductive and dielectric layers; and planarization. Often, a single wafer may undergo the same operations multiple times as each layer of circuit design is created. Frequently, it is desirable to clean the wafer to reduce interfacial contamination before certain process steps. Such cleaning may comprise exposing the wafer surface to reactive ion plasma or to other cleaning gases.

Wafer cleaning steps may be ex-situ or in-situ. An ex-situ cleaning step is one in which the wafer is cleaned in one process tool before the main processing occurs in another processing tool. Ex-situ cleaning may have certain disadvantages, including the potential for recontamination between the cleaning step and the next processing step. In this case, a limited time window between the cleaning step and the next processing step is required. An in-situ cleaning step is one in which the wafer is cleaned in the process tool which performs the main processing step. The existing art for in-situ cleaning of wafers requires placing the wafer in a fixed separate chamber or a fixed position within a transfer chamber. Such a separate chamber increases the cost, the processing time, and the space dedicated to the tool.

During cleaning, a wafer is typically placed on a chuck or similar support that keeps the wafer stationary while processing occurs. To accommodate the support, the chamber in which the wafer is cleaned is typically at least as wide and deep as the wafer diameter. The wafer is typically handled before cleaning to set it in place for the cleaning step which is to be performed and again after cleaning to remove the wafer from the chamber. In-situ cleaning offers the benefit of a cleaner and more controlled wafer surface as compared to ex-situ cleaning.

Other wafer cleaning processes or chemical treatment processes such as sputtering or vapor deposition are also typically performed in chambers that are at least as large as the wafer, in which the wafer remains stationary during treatment, and in which the wafer is typically handled to place and remove the wafer. There is a need in the art, therefore, for a more compact apparatus, especially one with reduced dimension in the direction of wafer movement. A related need is for an apparatus that permits plasma cleaning of wafers while the wafer is in transit from the load area to the main processing area.

SUMMARY OF THE INVENTION

To meet these and other needs, and in view of its purposes, the present invention provides a pass-through, wafer-processing tool for directing process gas onto a moving semiconductor wafer. The tool comprises an open-ended, non-isolated processing module having a wafer entry, a wafer exit, and a wafer passage connecting the wafer entry and wafer exit. The wafer passage is dimensioned to accommodate travel of the wafer through the passage. The tool further comprises two vacuum manifolds, one mounted adjacent the wafer entry and one mounted adjacent the wafer exit, and a gas manifold between the vacuum manifolds adapted to direct process gas onto the moving wafer. The pass-through, wafer-processing tool has a depth between the entry and exit that is less than the wafer diameter.

The process gas may comprise ammonia, hydrogen, or nitrogen but is not limited to those gases. The tool is adapted to provide a cleaning step, a sputtering step, a chemical vapor deposition step, a plasma treatment step, or a reactive ion etching step.

One or more pass-through, wafer-processing tools of the present invention may be part of an integrated system of semiconductor wafer-processing stations in a cluster configuration. A wafer handler is adapted to carry a wafer sequentially from a processing station before the pass-through, wafer-processing tool; through the pass-through, wafer-processing tool; and into a processing station after the pass-through, wafer-processing tool. Such a wafer handler is a robotic handler adapted to control the speed of the wafer through the pass-through, wafer-processing tool. In particular, the pass-through, wafer-processing tool is a pre-cleaner adapted to clean the wafer in preparation for the process performed in the sequential processing station.

The gas manifold is connected to a remote plasma unit outside the module and adapted to deliver plasma ions generated by the remote plasma unit to the moving wafer. Alternatively, the process gas is a reactive gas from which a plasma is generated in the pass-through, wafer processing tool. In such a case, the tool comprises a top electrode mounted in the module above the wafer passage and a wafer handler carrying the wafer through the wafer passage from underneath the wafer, functioning as a bottom electrode, and having DC-biasing capability. A radio-frequency (RF) source connected to the top electrode delivers sufficient RF energy to generate a plasma from the reactive gas bounded by the top electrode, the wafer, and the vacuum manifolds. The top electrode may be a baffle plate of the gas manifold.

The process of the present invention comprises generating a plasma from reactive gas supplied by the gas manifold. The process further comprises moving the semiconductor wafer on a robotic handler functioning as a bottom electrode underneath the wafer in a path underneath a top electrode mounted above the moving wafer. RF energy is delivered to the top electrode sufficient to generate a plasma from the reactive gas in a region bounded by the vacuum manifolds, the top electrode, and the wafer. The wafer handler is DC-biased to attract plasma ions from the plasma to impinge upon the wafer. In the alternative, the process gas may comprise a plasma containing plasma ions, and the process may comprise directing the plasma ions onto the moving wafer by generating the plasma ions in a remote plasma unit outside the module and delivering the plasma ions onto the moving wafer through the gas manifold.

The present invention also includes any plasma-generating device for exposing a moving semiconductor wafer to a plasma. The device comprises a robotic handler adapted to move the wafer and to serve as a bottom electrode underneath the wafer, a top electrode mounted above the moving wafer, reactive gas between the top electrode and the wafer, and an RF source connected to the top electrode and capable of delivering sufficient RF energy to generate a plasma from the reactive gas between the top electrode and the wafer. A process for exposing a moving semiconductor wafer to a plasma comprises placing the semiconductor wafer on a robotic handler adapted to serve as a bottom electrode underneath the wafer, moving the wafer with the robotic handler in a path underneath a top electrode mounted above the moving wafer, delivering a reactive gas between the top electrode and the moving wafer, and delivering RF energy to the top electrode sufficient to generate a plasma from the reactive gas between the top electrode and the wafer.

The present invention may also comprise a process for treating a moving semiconductor wafer with process gas in a pass-through, wafer-processing tool comprising an open-ended, non-isolated processing module enclosure. The process comprises moving the wafer into the pass-through, wafer-processing tool through a wafer entry port in the module and along a wafer passage dimensioned to accommodate travel of the wafer through the module. Then, the wafer is moved past an entry vacuum manifold adjacent the wafer entry port, past a gas manifold that directs process gas onto the moving wafer, and past an exit vacuum manifold adjacent the wafer exit port in the module through which the wafer then exits the tool.

The process may further comprise moving the semiconductor wafer from a preceding semiconductor processing tool before passing through the pass-through, wafer-processing tool and to a subsequent semiconductor processing tool after passing through the pass-through, wafer-processing tool. The process may be performed as the wafer travels in a first direction through the pass-through, wafer-processing tool to a subsequent semiconductor processing tool and again as the wafer passes back from the semiconductor processing tool through the pass-through, wafer-processing tool in a direction opposite the first direction.

It is to be understood that both the foregoing general description and the following detailed description are exemplary, but are not restrictive, of the invention.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawing are the following figures.

DETAILED DESCRIPTION OF THE INVENTION

Figure 1:
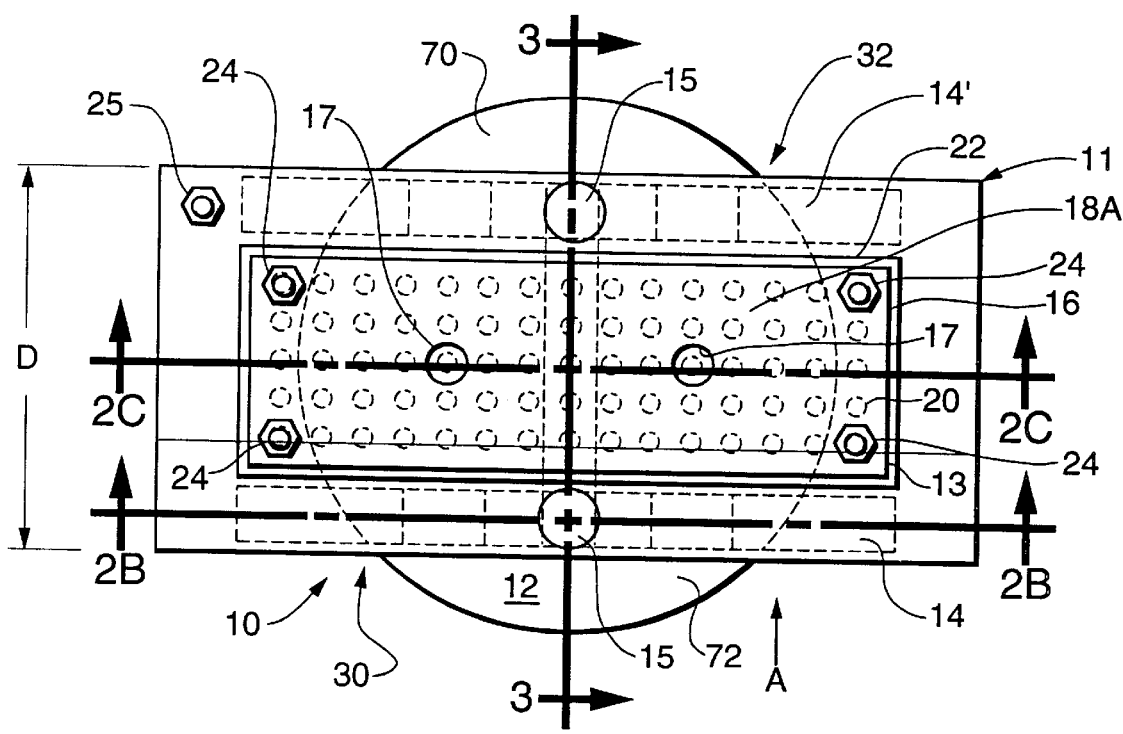
FIG. 1 is a top view illustration of an exemplary apparatus of the present invention, showing hidden internal components with dotted lines.
Figure 2A:
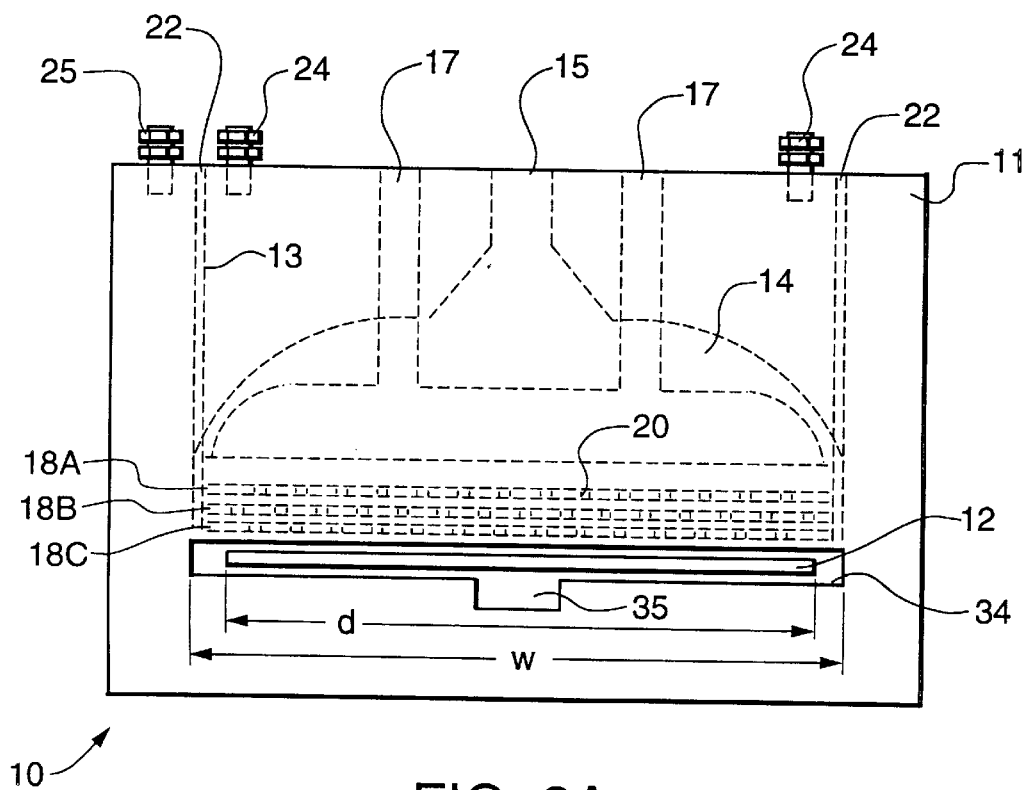
FIG. 2A is a side view illustration of the exemplary apparatus of FIG. 1, showing hidden internal components in dotted lines.
Figure 2B:
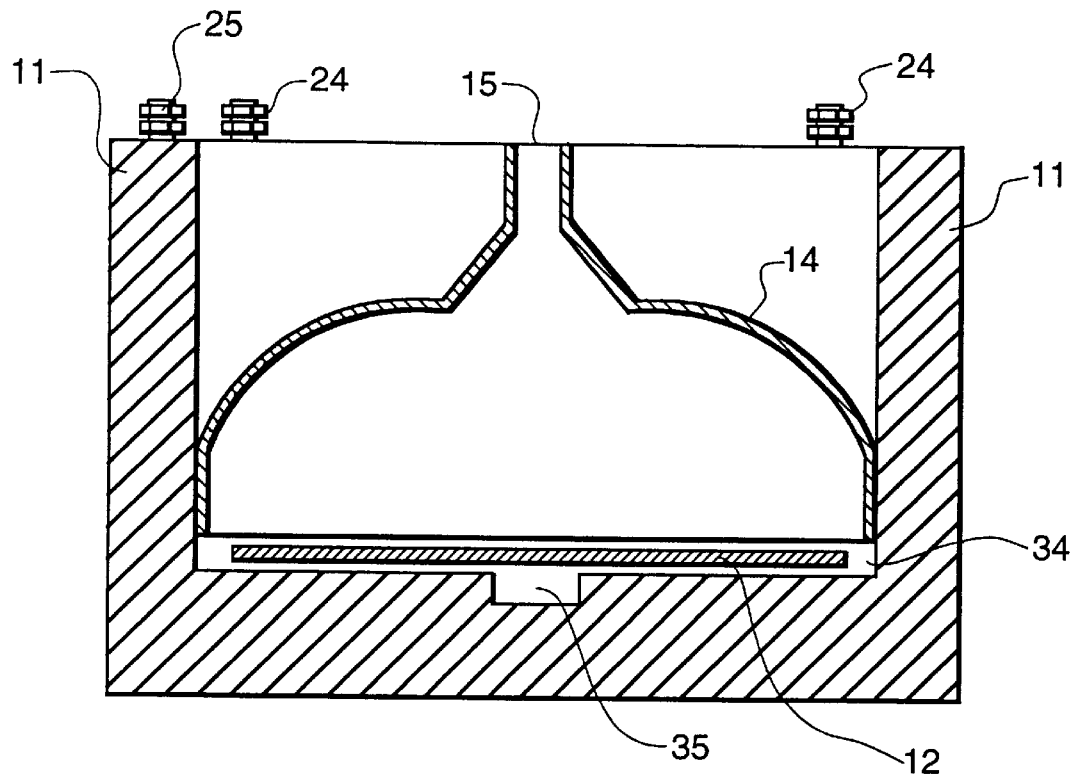
FIG. 2B is a cross-sectional illustration taken across line 2B—2B of FIG. 1.
Figure 2C:
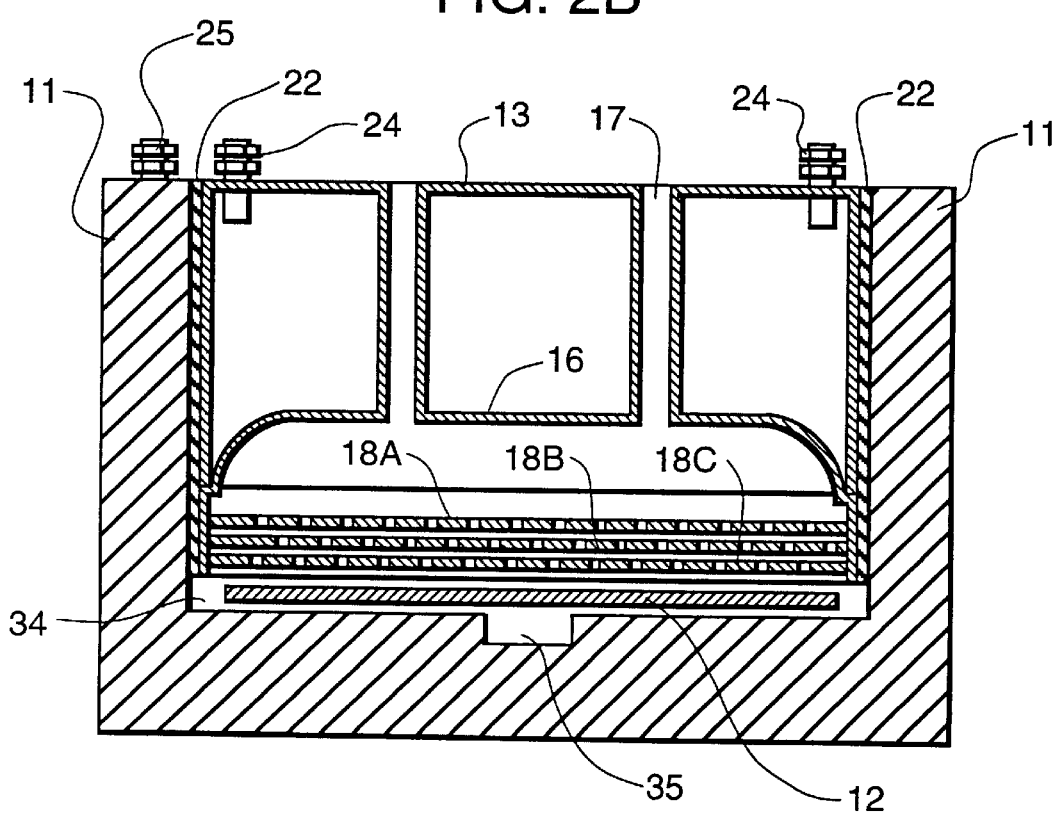
FIG. 2C is a cross-sectional illustration taken across line 2C—2C of FIG. 1.
Figure 3:
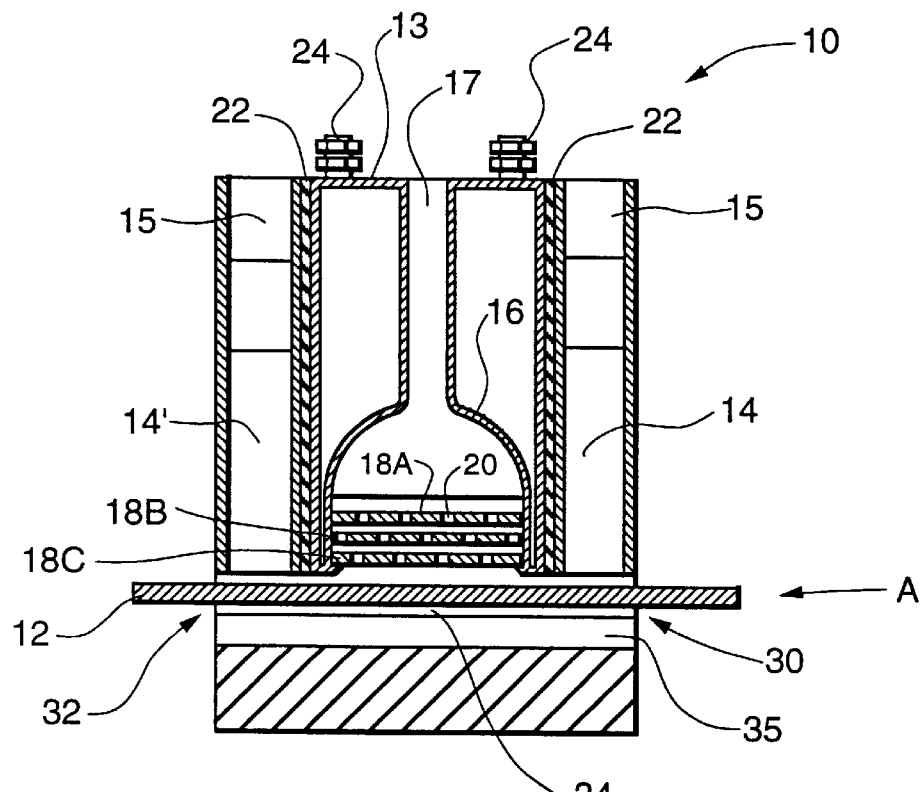
FIG. 3 is a cross-sectional illustration taken across line 3—3 of FIG. 1.

Referring now to the drawing, in which like reference numbers refer to like elements throughout, FIGS. 1, 2A, 2B, 2C, and 3 show various views of an exemplary pass-through, wafer-processing tool 10 of the present invention for directing process gas (not shown) onto a moving semiconductor wafer 12. Tool 10 comprises an open-ended, non-isolated processing module 11 having a wafer entry 30, a wafer exit 32, a wafer passage 34 connecting the wafer entry and wafer exit 32. Wafer passage 34 is dimensioned to accommodate travel of wafer 12 through the wafer passage 34, and thus has a width "w" wider than the diameter "d" of wafer 12, as shown in FIG. 2A. Typically, however, tool 10 has a depth "D" between wafer entry 30 and wafer exit 32 that is less than wafer diameter "d". Although tool 10 may have a depth "D" wider than wafer diameter "d," providing a depth smaller than diameter "d" provides compactness and reduces the wafer transfer path and time through the tool 10. Because tool 10 typically has a depth "D" that is smaller than wafer diameter "d," when the wafer 12 moves along arrow A in FIG. 1, the forward portion 70 of wafer 12 completely moves through tool 10 before the rear portion 72 of wafer 12 even enters tool 10.

A first vacuum manifold 14 is mounted adjacent wafer entry 30 and a second vacuum manifold 14' is mounted adjacent wafer exit 32. Each manifold 14, 14' has a vacuum connection port 15 connected to a vacuum source (not shown). Together, vacuum manifolds 14, 14' provide a desired pressure inside module 11. For instance, a low pressure may be desired such that a plasma may be maintained in module 11. A gas manifold 16, having a gas inlet 17 and one or more baffle plates 18A, 18B, 18C each having holes 20 to provide even flow distribution, is provided between vacuum manifolds 14, 14'. Gas manifold 16 may emit any process gas required for cleaning or for carrying out a desired gas treatment. In one embodiment, plasma from an external plasma generation unit (not shown) may flow through gas manifold 16 and onto the surface of wafer 12. In such an embodiment, the wafer handler, such as a plate or paddle 37 shown on the robotic handler 36 in FIG. 5 adapted to carry wafer 12 through wafer passage 34 from underneath the wafer 12, is biased to ground.

In another embodiment, reactive gas, such as but not limited to ammonia ($NH_3$), hydrogen ($H_2$), nitrogen ($N_2$), or a combination of these, may flow through gas manifold 16 and the plasma may be struck and generated in the space between the surface of wafer 12 and the bottom-most baffle plate 18C closest to the wafer surface. Baffle plate 18C serves as a top electrode above wafer 12 in wafer passage 34. In this embodiment, the wafer handler, such as paddle 37 shown on robotic handler 36 in FIG. 5, serves as a bottom electrode. A slot 35 provides space for the paddle 37 to travel through tool 10 with wafer 12 on top. Slot 35 may be fitted with a seal.

Reactive gas (not shown) flows from gas manifold 16 between moving wafer 12 on bottom electrode paddle 37 and top electrode baffle plate 18C. An RF source (not shown) capable of delivering sufficient RF energy to generate a plasma from the reactive gas between the top electrode baffle plate 18C and wafer 12 is connected to baffle plate 18C as described below. Paddle 37 is DC-biased so that the plasma ions are attracted to wafer 12. In some embodiments, when cooling of wafer 12 is desired, the wafer handler may provide a cooling gas flow and may thus be sufficiently DC-biased not only to attract the plasma ions, but also to counteract the force of the cooling gas coming up from underneath the wafer 12.

As shown in FIGS. 1, 2A, 2B, 2C, and 3, gas manifold 16 is part of a plasma unit insert 13. Plasma unit insert 13 essentially comprises a conductive, rectangular insert into which gas manifold 16 is mounted and electrically connected. Plasma unit insert 13 is isolated from the remainder of module 11 by an insulation 22. All electrical component are sufficiently isolated to avoid potential arcing.

RF couplings 24 are connected to plasma unit insert 13, as shown in FIGS. 1, 2A, 2B, 2C, and 3, such that the RF energy from the RF energy source (not shown) connected to couplings 24 is conducted down to baffle plate 18C. The RF energy then excites the reactive gas bounded vertically between baffle plate 18C and the surface of wafer 12 and horizontally between vacuum manifolds 14 and 14'. Module 11 is grounded through grounding coupling 25.

As shown in FIGS. 1, 2A, 2B, 2C, and 3, gas manifold 16 is not electrical isolated from plasma unit insert 13. Therefore, RF couplings 24 merely comprise bolts attached to the top of plasma unit insert 13 and connected to an RF energy source (not shown). RF energy is conducted through plasma unit insert 13 through gas manifold 16 down to baffle plate 18C. In an alternate embodiment, however, the bulk of gas manifold 16 may be electrically isolated from RF energy, and only bottom baffle plate 18C may be connected to the RF energy source. In such a case, the RF energy source is attached directly to baffle plate 18C, which must be electrically isolated from the rest of gas manifold 16.

Figure 5:
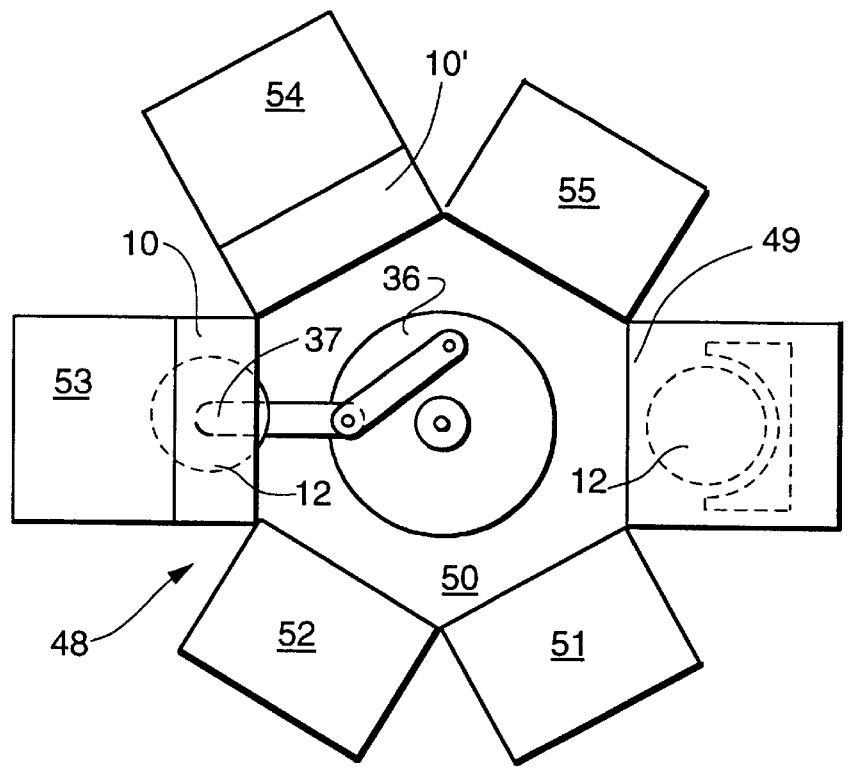
FIG. 5 is a top view schematic illustration of an exemplary cluster tool system incorporating two exemplary pass-through, wafer-processing tools of the present invention.
Figure 6:
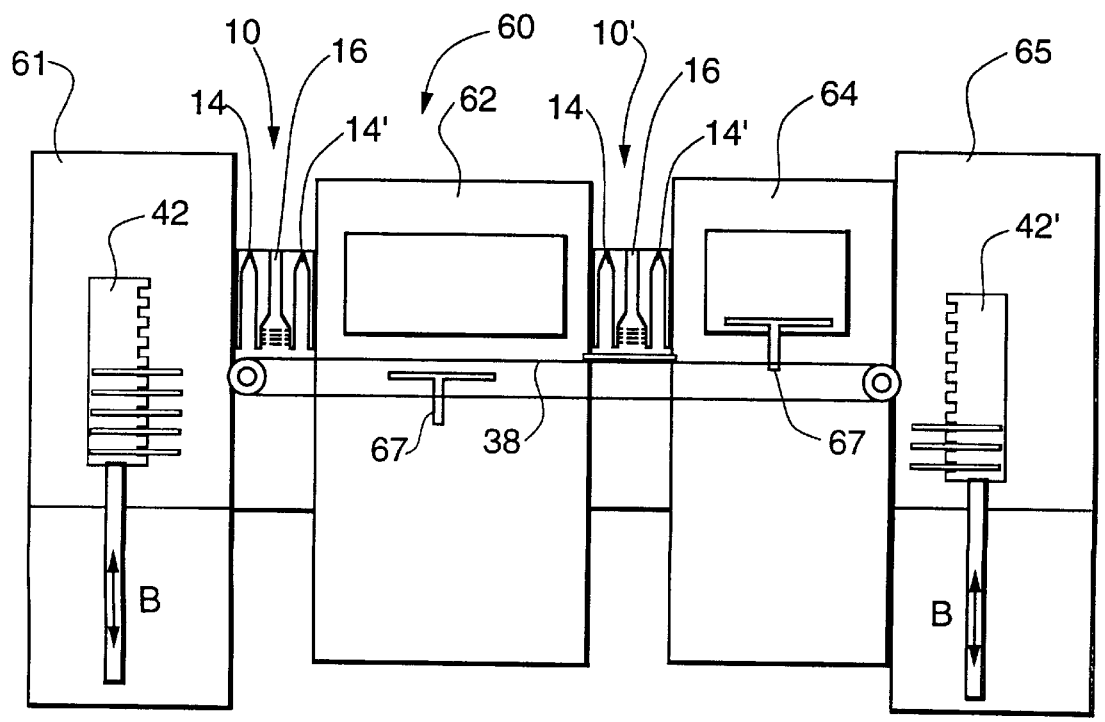
FIG. 6 is a side view schematic illustration of an exemplary linear system incorporating two, exemplary, pass-through, wafer-processing tools of the present invention.

The wafer handler, such as robotic handler 36 as shown in FIG. 5 or conveyor 36' as shown in FIG. 6, is adapted to control movement of wafer 12 through tool 10 at a desired speed that enables sufficient gas treatment of the wafer surface. Vacuum manifolds 14, 14' and the vacuum source connected to vacuum manifolds 14, 14' are sized so that the low pressure required to strike and maintain a plasma may be established and maintained between gas manifold 16 and wafer 12. In operation, the pressure in tool 10, the gas flow through gas manifold 16, and the power provided through RF couplings 24 are modified to adjust for loading effects as different surface areas of wafer 12 are exposed to the reactant species as wafer 12 passes through tool 10. For an embodiment in which baffle plate 18C is very narrow in the direction "A" of travel of wafer 12, the cleaning or etching may be almost one-dimensional in a line.

Figure 4:
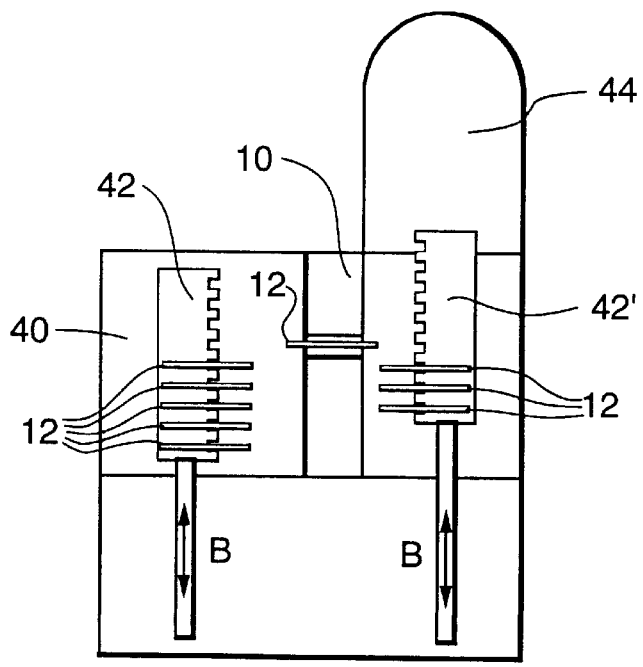
FIG. 4 is a side view schematic illustration of an exemplary batch system corporating an exemplary pass-through, wafer-processing tool of the present invention.

Pass-through, wafer-processing tool 10 is typically part of an integrated system of semiconductor wafer processing tools, as shown in FIGS. 4, 5, and 6. For example, in one exemplary batch system shown in FIG. 4, tool 10 is located between a loadlock chamber 40 and a batch chamber 44, such as of a vertical batch furnace tool. Quartz boats 42, 42' in each chamber 40 and 44, respectively, are capable of indexing in either direction along the two-headed arrow B to align wafers 12 for loading and unloading. In such a system, vacuum manifolds 14, 14' (shown in FIGS. 1, 2A, 2B, 2C, and 3) typically pump down the pressure to the desired pressure in loadlock chamber 40 and batch chamber 44 as well as in tool 10. Vacuum manifolds 14, 14' also provide a barrier to prevent the treatment gas, such as plasma ions, from leaving tool 10.

Once the pressure is adjusted to the desired pressure, the wafer handler (not shown) typically takes each wafer 12 from quartz boat 42 in loadlock chamber 40, passes it through tool 10 for cleaning or other processing, and then places it on quartz boat 42'. Once quartz boat 42' is full, it can be indexed into batch chamber 44 for processing, such as heating in the furnace, and then indexed back for unloading of wafers 12 back into quartz boat 42 in loadlock chamber 40. During passage back through tool 10, the wafers 12 may optionally be cleaned or processed again, if desired. Thus, the wafer exit 32 and exit vacuum manifold 14' for a wafer 12 traveling in a first direction into batch chamber 44 become the wafer entry 30 and entry vacuum manifold 14, respectively, for a wafer 12 traveling in the opposite direction back to loadlock chamber 40.

In an exemplary embodiment of cluster tool 48, such as shown in FIG. 5, pass-through, wafer-processing tools 10 and 10', such as plasma cleaning tools, may be placed between a transfer chamber 50 and one or more process chambers in which tools operate that require a cleaned wafer for processing. Thus, as shown in FIG. 5, robotic handler 36 picks up a wafer 12 with paddle 37 from load-unload tool 49 and then proceeds to put a wafer 12 in first process chamber 51 and second process chamber 52 sequentially for processing. Then, as wafer 12 is being inserted into third process chamber 53, it may be passed through tool 10 for cleaning. After processing in third process chamber 53, wafer 12 is then retrieved by robotic handler 36 and passed back through tool 10. Wafer 12 may be cleaned again as it passes back through tool 10, or it may be cleaned by tool 10' on the front end of fourth process chamber 54 as the wafer 12 is inserted. Also shown in FIG. 5 is a fifth process chamber 55.

A single tool 10 on the front end of third process chamber 53 may be sufficient for a processing sequence of tool 10, third process chamber 53, tool 10, fourth process chamber 54. If another cleaning step is needed after fourth process chamber 54, or if fourth process chamber 54 is used following processing in other than third process chamber 53, however, having tool 10' on the front end of fourth process chamber 54 is desirable. In such a configuration, each process chamber that needs a pre-cleaning or post-cleaning step has its own pass-through, wafer-processing tool, so only a single robotic motion is needed to clean the wafer 12 and deposit it in the downstream process chamber for processing. The motion of robotic handler 36 is controlled by the main controls for the cluster tool 48 such that if a certain speed is needed to effect proper cleaning in tool 10, the robot speed is controlled when passing through tool 10 accordingly. Similarly, the remotely generated plasma gas or the reactive gas to be excited into a plasma in situ within tool 10 may be controlled so that the gas or plasma flows when any part of wafer 12 passes through tool 10.

In yet another embodiment, shown in FIG. 6, pass-through, wafer-processing tools 10 and 10', such as plasma cleaning tools, are incorporated into a linear array 60 of processing tools 62 and 64 requiring pre-cleaning steps. The wafer handler, which is a conveyor belt 38 rather than a robotic handler 36 and paddle 37, takes each wafer 12 from first quartz boat 42 in the loading station 61. Conveyor belt 38 then takes wafer 12 through pass-through, wafer-processing tool 10 for cleaning and then to processing tool 62, such as a poly tool. In processing tool 62, wafer 12 is transferred to chuck 67, such as with a robotic handler (not shown), and chuck 67 moves the wafer 12 into position for processing within processing tool 62. Wafer 12 is then placed back on conveyor belt 38 and carried through tool 10' for cleaning again. Wafer 12 then proceeds for processing in processing tool 64, such as an oxide tool, and then is conveyed to and loaded into second quartz boat 42' in unloading station 65. Conveyor belt 38 may comprise a conductive belt that is DC-biased so that, as conveyor belt 38 carries a wafer 12 through tools 10 or 10', it can function as the bottom electrode for generation of plasma as previously described. In the alternative, conveyor belt 38 may be commonly grounded and the plasma remotely generated and piped in through gas manifold 16.

In multi-chamber configurations, in which the pass-through, wafer-processing tool 10, 10' is positioned between two processing tools or chambers, such as shown in FIGS. 4, 5, and 6, it may be desired to have purge gases in the processing tools or chambers on either side of the tool 10, 10', such as in processing tools 62 and 64 in FIG. 6. Optionally, purge gas curtains may be provided adjacent the entry and exit of tool 10, 10' to provide a steady gas flow into tool 10, 10' from the adjacent processing tools or chambers that prevents leakage of plasma gases into the adjacent processing tools or chambers. Thus, vacuum manifolds 14 and 14' may serve not only to pump out from tool 10, 10' reactive gases used to clean or etch the wafer 12, but also to pump inert purge gases from either or both processing tools or chambers attached adjacent wafer entry 30 and wafer exit 32 of tool 10, 10'. Therefore, vacuum manifolds 14 and 14' and purge gas flows in adjacent processing tools or chambers are typically balanced to assure that a low enough pressure is maintained inside module 11 of tool 10, 10' to strike and maintain plasma and to assure that no gas leaks out.

Thus, the pass-through, wafer-processing tool 10 of the present invention provides a method of treating a moving semiconductor wafer 12 with a process gas. The method comprises moving wafer 12 into pass-through, wafer-processing tool 10 through wafer entry 30 in module 11 and along wafer passage 34 dimensioned to accommodate travel of wafer 12 through module 11. Wafer 12 is then moved past entry vacuum manifold 14 adjacent wafer entry 30, past gas manifold 16 adapted to direct process gas onto the moving wafer 12, past exit vacuum manifold 14' adjacent wafer exit 32, and out of module 11 through wafer exit 32.

When a plasma is generated within tool 10, the method comprises generating a plasma by moving wafer 12 on a robotic handler 36 forming a bottom electrode underneath wafer 12 in a path underneath a top electrode (baffle plate 18C) mounted above moving wafer 12. A reactive gas is delivered between the top electrode and moving wafer 12, and RF energy is delivered to the top electrode sufficient to generate plasma from the reactive gas between the top electrode and wafer 12. Other apparatus for generating plasma between a moving wafer and an electrode may also be used, consistent with the present invention, in which the wafer handler acts as a bottom electrode or cathode. As described previously, wafer 12 may also be exposed to plasma generated in any remote plasma unit (not shown) known in the art for generating a remote plasma, with the plasma ions piped into module 11 through gas manifold 16.

Figure 7:
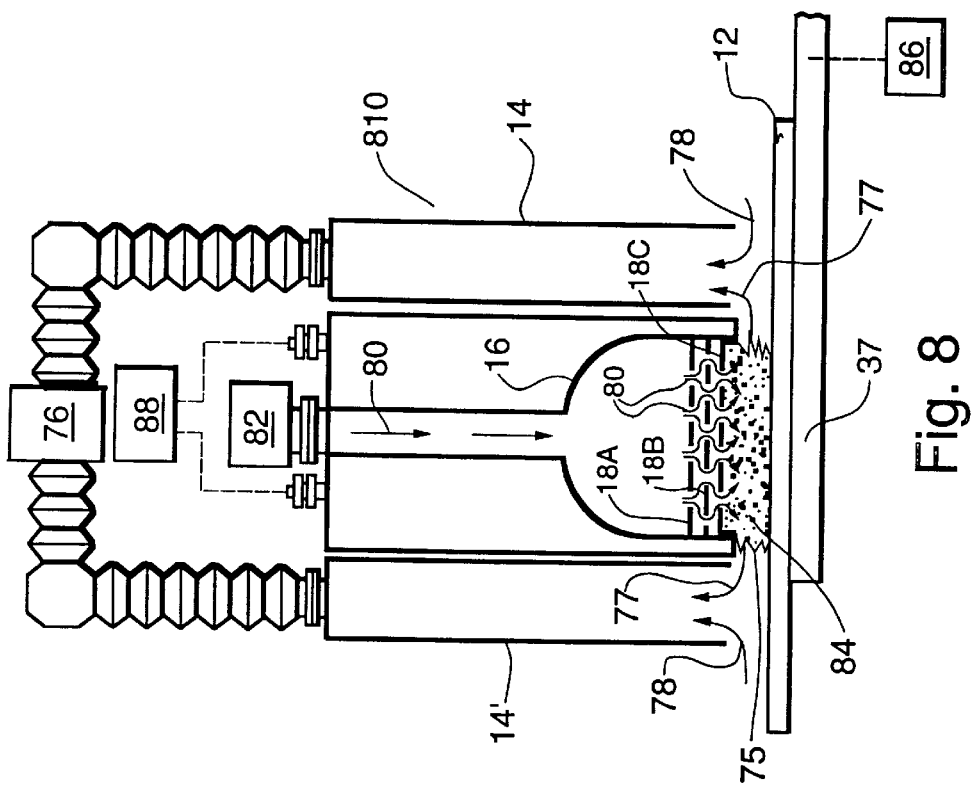
FIG. 7 is a side view schematic illustration of an exemplary pass-through, wafer-processing tool of the present invention in which the plasma is obtained from a remote plasma source.
Figure 8:
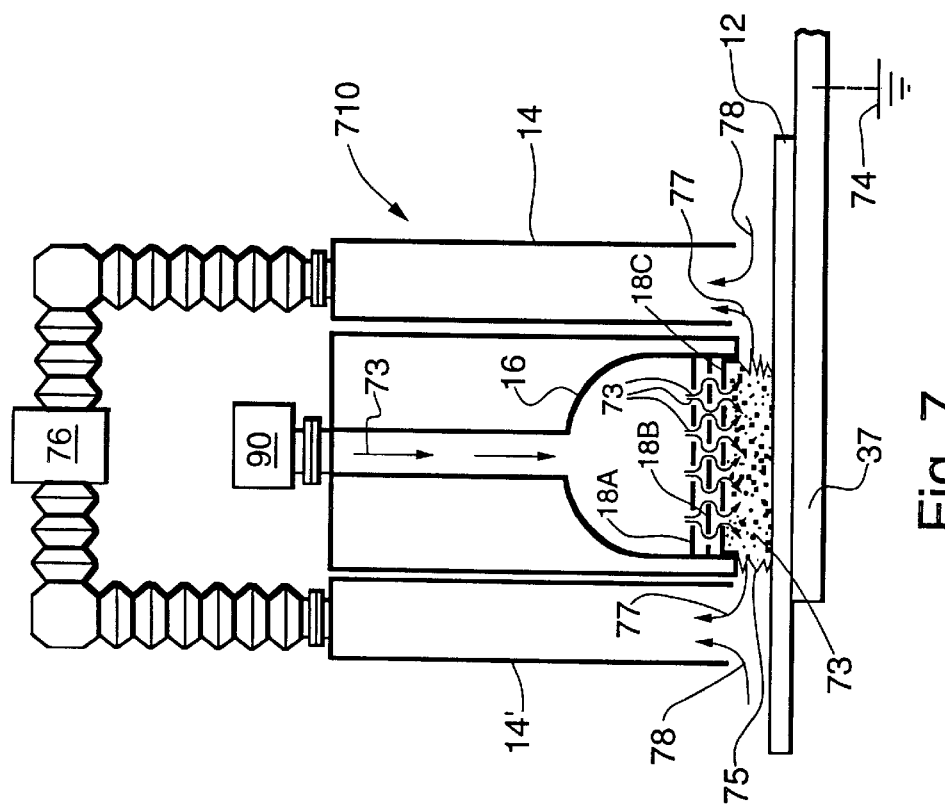
FIG. 8 is a side view schematic illustration of an exemplary pass-through, wafer-processing tool of the present invention in which the plasma is generated in situ.

Referring now to FIGS. 7 and 8, there are shown schematic side views of two exemplary pass-through, wafer-processing tool embodiments 710 and 810, respectively. As wafer 12 is passed through tool 710 by paddle 37 as shown in FIG. 7, vacuum source 76 pulls a vacuum through entry vacuum manifold 14 and exit vacuum manifold 14'. Vacuum manifolds 14 and 14' thus draw in external gases 78 (typically air) from outside tool 710 to maintain desired pressure levels inside tool 710, and draw in process gases 77 from inside tool 710 to prevent process gases 77 from leaking out of tool 710. Wafer 12 travels underneath gas manifold 16, where plasma 73 from remote plasma generator 90 flows through baffle plates 18A, 18B, and 18C and forms a plasma treatment zone 75 between baffle plate 18C, wafer 12, and entry and exit vacuum manifolds 14 and 14'. Paddle 37 is biased to ground 74.

In an alternate embodiment such as tool 810 as shown in FIG. 8, wafer 12 is similarly carried through tool 810 by paddle 37 as vacuum source 76 pulls a vacuum through entry vacuum manifold 14 and exit vacuum manifold 14'. Again, both external gases 78 from outside tool 810 and process gases 77 from inside tool 810 are drawn into vacuum manifolds 14, 14' to maintain pressure inside tool 810 and to prevent process gases 77 from leaking out of tool 810. In tool 810, however, when wafer 12 travels underneath gas manifold 16, reactive gas 80 from a gas source 82 flows through baffle plates 18A, 18B, and 18C while RF energy from RF source 88 is delivered to bottom baffle plate 18C. The RF energy is sufficient to strike and maintain plasma 84 within plasma treatment zone 75 between baffle plate 18C, wafer 12, and entry and exit vacuum manifolds 14, 14'. Paddle 37 is DC-biased by a DC source 86 such that the plasma ions are attracted to wafer 12.

Although described above with reference to an embodiment in which wafer 12 is cleaned with plasma, the pass-through, wafer processing tool 10 of the present invention may be used for a multitude of cleaning or other gas treatment processes. For instance, gas manifold 16 may be used to provide hydrogen fluoride (HF) gas, $NH_3/H_2$ gas, or $N_2/H_2$ gas to perform other types of non-plasma cleaning, as are known in the art. Rather than performing a cleaning operation, a plasma may be generated for providing a reactive ion etching (RIE) step, or non-plasma processes may be performed, such as chemical vapor deposition (CVD) or Argon or other gas sputtering operations. Thus, the present invention comprises a pass-through, wafer-processing tool 10 for any type of semiconductor wafer gas treatment process known in the art.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A pass-through wafer-processing tool for treatment of a moving semiconductor wafer with a process gas, said tool comprising:

an open-ended, non-isolated processing module having a wafer entry, a wafer exit, and a wafer passage connecting the wafer entry and wafer exit, said wafer passage dimensioned to accommodate travel of said wafer through said passage;

a first vacuum manifold mounted adjacent said wafer entry;

a second vacuum manifold mounted adjacent said wafer exit; and a gas manifold adapted to direct said process gas onto said moving wafer between said vacuum manifolds.

2. The pass-through wafer-processing tool of claim 1 wherein said gas manifold is adapted to be connected to a remote plasma unit outside said processing module and said process gas comprises plasma ions generated by said remote plasma unit.

3. The pass-through wafer-processing tool of claim 2 further comprising a wafer handler connected to ground.

4. The pass-through wafer-processing tool of claim 1 wherein said process gas is a reactive gas and said tool further comprises:
a top electrode mounted in said processing module above said wafer passage;
a wafer handler carrying said wafer through said wafer passage from underneath said wafer, functioning as a bottom electrode, and having a DC-bias; and
an RF source connected to said top electrode and delivering sufficient RF energy to strike and maintain said reactive gas in a plasma bounded between said vacuum manifolds, said top electrode, and said wafer.

5. The pass-through wafer-processing tool of claim 4 wherein said top electrode comprises a baffle plate within said gas manifold.

6. The pass-through wafer-processing tool of claim 1 further comprising a wafer handler.

7. The pass-through wafer-processing tool of claim 6 wherein said wafer handler is a robotic handler controlling movement of said wafer through said tool at a desired speed.

8. The pass-through wafer-processing tool of claim 1 wherein said wafer has a diameter and said tool has a depth between said wafer entry and said wafer exit that is less than said wafer diameter.

9. The pass-through wafer-processing tool of claim 1 wherein said process gas comprises at least one of ammonia, hydrogen, and nitrogen.

10. The pass-through wafer-processing tool of claim 1 wherein said tool is adapted to provide at least one of a cleaning step, a sputtering step, a chemical vapor deposition step, a plasma treatment step, and a reactive ion etching step.

11. An integrated system of semiconductor wafer processing tools comprising at least one pass-through wafer-processing tool according to claim 1.

12. The system of wafer processing tools of claim 11 further comprising a wafer handler sequentially carrying said wafer from a first processing tool before said pass-through wafer-processing tool, through said pass-through wafer-processing tool, and into a second processing tool after said pass-through wafer-processing tool.

13. The system of wafer processing tools of claim 12 wherein the pass-through, wafer-processing tool is a pre-cleaner adapted to clean said wafer in preparation for a process performed on said wafer in said second processing tool sequentially after the pass-through wafer-processing tool.

14. A process for treating a moving semiconductor wafer with process gas in a pass-through wafer-processing tool comprising an open-ended, non-isolated processing module, said process comprising:
a) moving said wafer into said pass-through wafer-processing tool through a wafer entry in said processing module and along a wafer passage dimensioned to accommodate travel of said wafer through said processing module;
b) moving said wafer past an entry vacuum manifold adjacent said wafer entry;
c) moving said wafer past a gas manifold that delivers said process gas onto said moving wafer;
d) moving said wafer past an exit vacuum manifold adjacent a wafer exit in said processing module; and
e) moving said wafer out of said pass-through wafer-processing tool through a wafer exit in said processing module.

15. A process for treating a moving semiconductor wafer with process gas in a pass-through wafer-processing tool comprising a processing module, said process comprising:
a) moving said wafer into said pass-through wafer-processing tool through a wafer entry in said processing module and along a wafer passage dimensioned to accommodate travel of said wafer through said processing module;
b) moving said wafer past an entry vacuum manifold adjacent said wafer entry;
c) moving said wafer past a gas manifold that delivers said process gas onto said moving wafer;
d) moving said wafer past an exit vacuum manifold adjacent a wafer exit in said processing module; and
e) moving said wafer out of said pass-through wafer-processing tool through a wafer exit in said processing module;
wherein said wafer has a forward portion and a rear portion and said wafer moves in a forward direction in which said forward portion of said wafer completes steps (a) through (e) sequentially before said rear portion of said wafer begins step (a).

16. The process of claim 14 further comprising moving said semiconductor wafer from an upstream semiconductor processing tool prior to step (a) and moving said semiconductor wafer to a downstream semiconductor processing tool after step (e).

17. The process of claim 16 further comprising moving said wafer in a first direction through said pass-through wafer-processing tool and performing steps (a) through (e), performing an operation in said downstream semiconductor processing tool, and then moving the wafer back through said pass-through wafer-processing tool in a second direction opposite said first direction and performing steps (a) through (e).

18. The process of claim 14 wherein said process gas is a reactive gas and the process further comprises moving said semiconductor wafer on a wafer handler functioning as a bottom electrode underneath said wafer and, in step (c):
i) moving said wafer with said wafer handler in a path underneath a top electrode mounted above said moving wafer between said entry vacuum manifold at said exit vacuum manifold;
ii) delivering RF energy to said top electrode sufficient to generate a plasma from said reactive gas in a region bounded by said vacuum manifolds, said top electrode, and said wafer; and
iii) DC-biasing said wafer handler to attract plasma ions from said plasma to impinge upon said wafer.

19. The process of claim 14 wherein said process gas is a plasma containing plasma ions, the process further comprising directing said plasma ions onto said moving wafer in step (c) by generating said plasma ions in a remote plasma unit outside said processing module and delivering said plasma ions onto said moving wafer through said gas manifold.

20. The process of claim 19 further comprising moving said wafer with a wafer handler that is biased to ground.

21. A plasma-generating device for exposing a moving semiconductor wafer to a plasma, said device comprising:
a robotic handler for moving said wafer, said robotic handler forming a bottom electrode underneath said wafer;
a top electrode mounted above said wafer;
reactive gas between said top electrode and said wafer; and
an RF source connected to said top electrode and delivering sufficient RF energy to generate a plasma from said reactive gas between said top electrode and said wafer.

22. A process for exposing a moving semiconductor wafer to a plasma, said process comprising:
- a) placing said semiconductor wafer on a robotic handler forming a bottom electrode underneath said wafer;
- b) moving said wafer with said robotic handler in a path underneath a top electrode mounted above said moving wafer;
- c) delivering a reactive gas between said top electrode and said wafer; and
- d) delivering RF energy to said top electrode sufficient to generate a plasma from said reactive gas between said top electrode and said wafer.

23. A pass-through module comprising at open-ended, non-isolated module passage having a wafer entry and a wafer exit and dimensioned to accommodate travel therethrough of a wafer having a diameter, the wafer entry and wafer exit having a distance therebetween that is less than the wafer diameter, the module adapted to treat a portion of the wafer with a process gas during travel of the wafer between the wafer entry and wafer exit and having a first vacuum manifold supported adjacent the wafer entry to minimize how much process gas escapes the module through the wafer entry and a second vacuum manifold supported adjacent the wafer exit to minimize how much process gas escapes the module through the wafer exit.

24. The pass-through module of claim 23 wherein the process gas comprises a plasma of reactive ions.

* * * * *